(12) United States Patent
Kim et al.

(10) Patent No.: US 8,233,338 B2
(45) Date of Patent: Jul. 31, 2012

(54) MULTI-BIT TEST CONTROL CIRCUIT

(75) Inventors: Kwi-Dong Kim, Gyeonggi-do (KR); Mun-Phil Park, Gyeonggi-do (KR); Sung-Ho Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 240 days.

(21) Appl. No.: 12/792,444

(22) Filed: Jun. 2, 2010

(65) Prior Publication Data

US 2011/0103163 A1    May 5, 2011

(30) Foreign Application Priority Data

Oct. 30, 2009    (KR) ................. 10-2009-0104685

(51) Int. Cl.
*G11C 7/00*    (2006.01)
*G11C 8/00*    (2006.01)
(52) U.S. Cl. ............... 365/194; 365/191; 365/201
(58) Field of Classification Search ............ 365/194
See application file for complete search history.

(56) References Cited

U.S. PATENT DOCUMENTS

| 6,380,784 | B1 * | 4/2002 | Jeong .................. 327/261 |
| 7,701,786 | B2 * | 4/2010 | Lee .................. 365/189.11 |
| 7,813,211 | B2 * | 10/2010 | Kim et al. ............ 365/230.03 |
| 2012/0026809 | A1 * | 2/2012 | Yang .................. 365/189.15 |

FOREIGN PATENT DOCUMENTS

| JP | 11-317096 | 11/1999 |
| KR | 1019950015778 | 6/1995 |
| KR | 1020040100205 | 12/2004 |
| KR | 1020100030510 | 3/2010 |

OTHER PUBLICATIONS

Notice of Allowance issued by the Korean Intellectual Property Office on Dec. 28, 2011.

* cited by examiner

*Primary Examiner* — Son Mai
(74) *Attorney, Agent, or Firm* — IP & T Group LLP

(57) ABSTRACT

A multi-bit test control circuit includes an operation unit, a delay unit, and a generation unit. The operation unit is configured to combine a single source signal inputted to each bank with a delay signal generated by delaying the source signal by a certain time to generate a first pulse signal. The delay unit is configured to delay the first pulse signal by a certain time. The generation unit is configured to combine an output signal of the operation unit with an output signal of the delay unit to generate a second pulse signal for a bank interleaving multi-bit test.

23 Claims, 4 Drawing Sheets

MULTI-BIT TEST CONTROL CIRCUIT

CROSS-REFERENCE TO RELATED APPLICATIONS

The present application claims priority of Korean Patent Application No. 10-2009-0104685, filed on Oct. 30, 2009, which is incorporated herein by reference in its entirety.

BACKGROUND OF THE INVENTION

Exemplary embodiments of the present invention relate to a test control circuit, and more particularly, to a multi-bit test control circuit which tests plural banks at the same time to reduce a test time.

A semiconductor device may perform a test operation while activating all banks at the same time. However, in order to test a bank interleaving operation or reduce a peak current of power due to the activation of all banks, a single bank is activated in a test operation and a test data of the activated bank is outputted and investigated.

FIG. 1 is a configuration diagram illustrating a conventional semiconductor device which includes four banks and performs a multi-bit test operation.

Referring to FIG. 1, when four banks BK0 to BK3 are provided within a semiconductor device, each bank compresses data and performs a test thereon. When a bank interleaving operation is performed in a multi-bit test operation, one bank is selected and output data of the banks except for the selected bank are set to a certain logic level.

As one example, when a read operation is performed on the bank BK0 in the multi-bit test operation, the output signals of the remaining banks BK1 to BK3 are set to a logic high level. Therefore, test data DATA_BK1 to DATA_BK3 of the banks BK1 to BK3 are set so that output signal of driving units TGO_DRV BK1 to TGO_DRV BK3 can be in a logic high level. The driving unit TGO_DRV BK0 which reads test data DATA_BK0 of the bank BK0 can output data according to the read operation on the bank BK0.

As illustrated in a timing diagram of FIG. 2, control signals IOFIX_BK1 to IOFIX_BK3 for reading data of the banks BK1 to BK3 are controlled to be in a logic high level, unlike a control signal IOFIX_BK0 for reading data of the bank BK0. Through such a control operation, the data of the bank BK0 is read out.

FIG. 3 is a block diagram illustrating the driving unit shown in FIG. 1. Specifically, the driving units TGO_DRV BK0 to TGO_DRV BK1 corresponding to the banks BK0 to BK1 are illustrated as an example. FIG. 4 is a configuration diagram illustrating a circuit for generating a control signal for the bank BK0 according to the conventional multi-bit test operation.

According to the configurations of FIGS. 3 and 4, the control signal IOFIX is set to a logic low level in a typical multi-bit test operation. At this time, when the control signal IOFIX is in a logic low level, a data fixing unit DATA_IOFIX outputs data information, i.e., DATA_BK0 or DATA_BK1, to a driving unit TGO_DRV as it is. Meanwhile, when the control signal IOFIX is in a logic high level, the data fixing unit DATA_IOFIX outputs a logic high level signal to the driving unit TGO_DRV regardless of the data information.

When a signal IOSTB_TGO inputted to the driving unit TGO_DRV becomes a logic high level, the driving unit TGO_DRV outputs information TGO_DATA from the data fixing unit DATA_IOFIX. Output information of the driving unit TGO_DRV is outputted to the outside of the semiconductor device through a data output pad DQ. Therefore, in the typical multi-bit test operation, data is read from each bank. When the signal IOSTB_TGO is enabled, read data of all banks are outputted at the same time.

However, when the bank interleaving operation is performed, for example, only the bank corresponding to a read command outputs data and, for example, only the signal IOSTB_TGO inputted to the corresponding bank is enabled. In the remaining banks except for the corresponding bank, the control signal IOFIX is set to a logic high level and thus the output signals of the data fixing units DATA_IOFIX are set to a logic high level as described above. The signal IOSTB_TGO inputted to the remaining banks is also disabled, and the output signals of the driving units TGO_DRV are set to a logic high level.

Meanwhile, as illustrated in FIG. 4, the control signal IOFIX and the signal IOSTB_TGO are generated in order to control the multi-bit test operation of each bank. The control signal IOFIX is a signal which determines whether to output the data information of the data fixing unit. That is, the data information is outputted or a set signal of a logic high level is outputted regardless of the data information in response to the control signal IOFIX. The control signal IOFIX signal is generated by combining a multi-bit test mode signal MULTI_BIT_TM indicating a bank interleaving multi-bit test operation mode and a source signal IOFIX_source having a low pulse (tIOFIX duration) only in the read operation. Also, the signal IOSTB_TGO is generated by delaying a signal PINB by a certain time. The PINB signal is a source signal of all signals inputted to each bank.

As discussed above, various source signals such as the signals IOFIX_source PINB are used to control the conventional multi-bit test operation, and thus signal lines, control logics, and so on for these signals are also used. Moreover, due to the use of these signal lines, it is difficult to secure a margin between signals.

SUMMARY OF THE INVENTION

Exemplary embodiments of the present invention are directed to a multi-bit test control circuit which is capable of reducing source signals and simplifying control logics for a multi-bit test control operation.

In accordance with an exemplary embodiment of the present invention, a multi-bit test control circuit includes an operation unit configured to combine a single source signal inputted to each bank with a delay signal generated by delaying the source signal by a certain time to generate a first pulse signal, a delay unit configured to delay the first pulse signal by a certain time, and a generation unit configured to combine an output signal of the operation unit with an output signal of the delay unit to generate a second pulse signal for a bank interleaving multi-bit test.

The generation unit may be configured to generate the single second pulse signal with respect to each bank.

The first pulse signal may have a pulse that starts according to information of the source signal and ends according to information of the delay signal.

The delay unit may be configured to ensure a timing margin of an end of the second pulse signal.

The second pulse signal may be combined with a multi-bit test mode signal to generate a final bank interleaving multi-bit test control signal.

In accordance with another exemplary embodiment of the present invention, a multi-bit test control circuit includes a first generation unit configured to delay a single source signal inputted to each bank to generate a first control signal for a bank enable operation in a multi-bit test operation, and a second generation unit configured to combine the single source signal inputted to each bank with a delay signal generated by delaying the source signal to generate a second control signal for a bank interleaving multi-bit test operation.

The first generation unit may be configured to generate the first control signals with respect to the banks, respectively.

The first generation unit may be configured to generate the first control signal with respect to one or more banks.

The first generation unit may be configured to generate the identical first control signal with respect to two banks.

The first generation unit may include a first delay section configured to delay a source signal inputted to a first bank; a second delay section configured to delay a source signal inputted to a second bank; and an operation section configured to combine an output signal of the first delay section with an output signal of the second delay section.

The second generation unit may include an operation section configured to combine the source signal inputted to each bank with the delay signal generated by delaying the source signal by a certain time to generate a first pulse signal; a delay section configured to delay the first pulse signal by a certain time; and a generation section configured to combine an output signal of the operation section with an output signal of the delay section to generate a second pulse signal for the bank interleaving multi-bit test operation.

The generation section may be configured to generate the single second pulse signal for the bank interleave multi-bit test with respect to each bank.

The first pulse signal may have a pulse that starts according to information of the source signal and ends according to information of the delay signal.

The delay unit may be configured to ensure a timing margin of an end of the second pulse signal.

The second pulse signal may be combined with a multi-bit test mode signal to generate a final control signal for the bank interleaving multi-bit test operation.

The multi-bit test control circuit may further include a data fixing unit configured to output data of the bank in response to the second control signal; and a driving unit configured to be enabled in response to the first control signal, and output an output of the data fixing unit to the outside.

The driving unit may be provided in each bank.

The first generation unit may be configured to generate the first control signals with respect to the banks, respectively.

The first generation unit may be configured to generate the identical first control signal with respect to two banks.

The first generation unit may include a first delay section configured to delay a source signal inputted to a first bank; a second delay section configured to delay a source signal inputted to a second bank; and an operation section configured to combine an output signal of the first delay section with an output signal of the second delay section.

The second generating unit may include an operator configured to combine the source signal inputted to each bank and the delay signal generated by delaying the source signal by a certain time to generate a first pulse signal; a delay configured to delay the first pulse signal by a certain time; and a generator configured to combine an output signal of the operator with an output signal of the delay to generate a second pulse signal for the bank interleaving multi-bit test operation.

The first pulse signal may have a pulse that starts according to information of the source signal and ends according to information of the delay signal.

The second pulse signal may be combined with a multi-bit test mode signal to generate a final control signal for the bank interleaving multi-bit test operation.

DESCRIPTION OF SPECIFIC EMBODIMENTS

Figure 1:
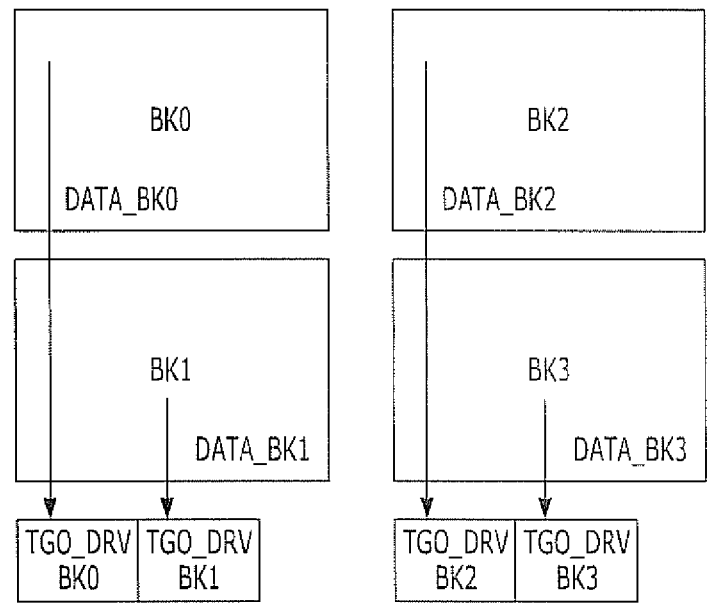
FIG. 1 is a configuration diagram of a conventional semiconductor device.
Figure 2:
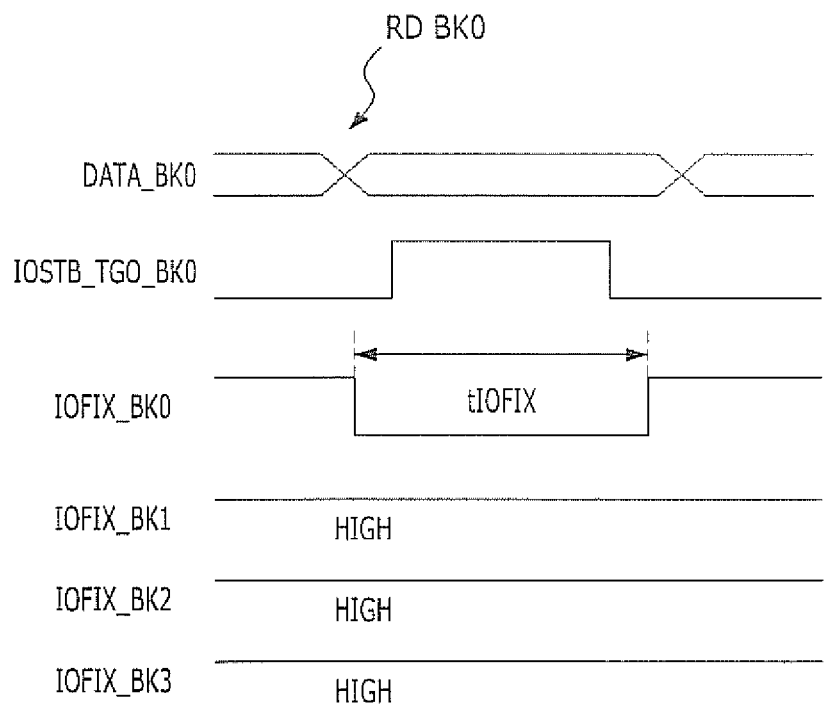
FIG. 2 is a timing diagram illustrating a conventional bank interleaving multi-bit test operation.
Figure 3:
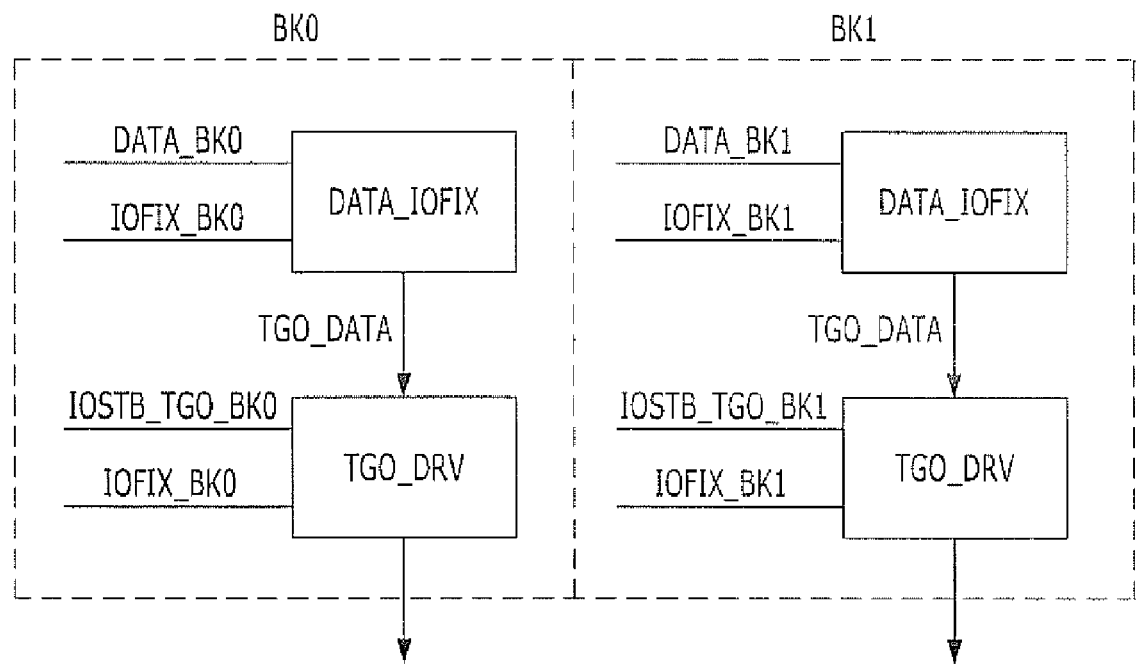
FIG. 3 is a configuration diagram illustrating a driving unit shown in FIG. 1.
Figure 4:
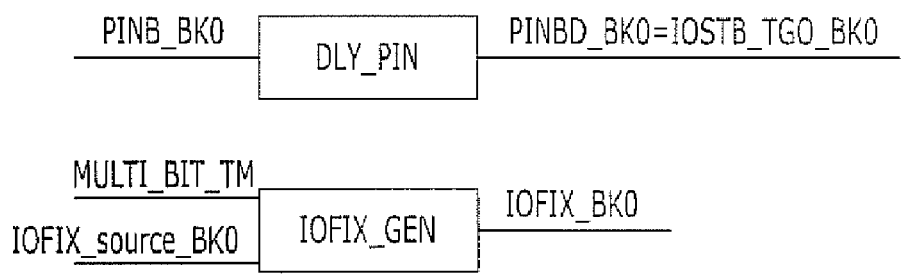
FIG. 4 is a configuration diagram illustrating a circuit generating a control signal for the conventional bank interleaving multi-bit test operation.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 5:
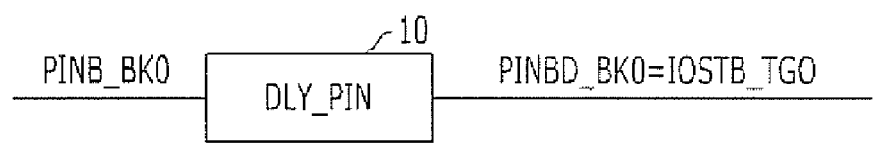
FIG. 5 is a configuration diagram illustrating a circuit generating a signal IOSTB in accordance with an embodiment of the present invention.

A basic block diagram in accordance with an embodiment of the present invention is illustrated in FIG. 5.

Referring to FIG. 5, a multi-bit test control circuit in accordance with an embodiment of the present invention is implemented to use, for example, a single signal PINB. The multi-bit test control circuit includes a delay circuit (DLY_PIN) 10 to generate a signal IOSTB_TGO by delaying the signal PINB signal by an appropriate delay. The signal PINB is a source signal inputted to each bank and is a source of all signals including the signal IOSTB_TGO and a YI enable signal.

Figure 6:
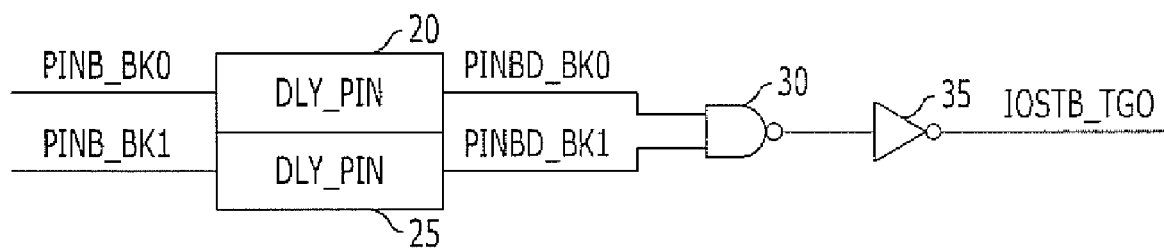
FIG. 6 is a configuration diagram illustrating a circuit generating the signal IOSTB in accordance with another embodiment of the present invention.

FIG. 6 illustrates a multi-bit test control circuit for generating the single signal IOSTB_TGO for plural banks in accordance with another exemplary embodiment of the present invention. Specifically, the control circuit includes a delay unit 20 configured to delay a source signal PINB_BK0 inputted to a bank BK0, a delay unit 25 configured to delay a source signal PINB_BK1 inputted to a bank BK1, a NAND gate 30 configured to perform a NAND operation on output signals of the delay units 20 and 25, and an inverter 35 configured to invert an output signal of the NAND gate 30.

In a typical multi-bit test operation, the signals IOSTB_TGO of all banks are enabled. Therefore, the signals IOSTB_TGO of two banks may be combined into a single signal to be used. That is, the source signal PINB_BK0 inputted to the bank BK0 and the source signal PINB_BK1 inputted to the bank BK1 may be delayed by the delay units 20 and 25 and combined into a single signal through the NAND gate 30 and the inverter 35.

Specifically, when the banks have a stack structure, a TGO driving unit is generally disposed under all banks as illustrated in FIG. 1. If the single signal IOSTB_TGO is used to control the two banks BK0 and BK1, it is efficient in terms of the arrangement of signal lines and the implementation of control logics.

FIG. 6 illustrates a case in which the signals PINB used in two banks are combined to generate a single signal IOSTB_TGO for two banks. As described in FIG. 5, the single signal IOSTB_TGO may be generated with respect to each bank. However, in both cases, only the signal PINB is used to generate the signal IOSTB_TGO in the exemplary embodiments of the present invention.

Figure 7:
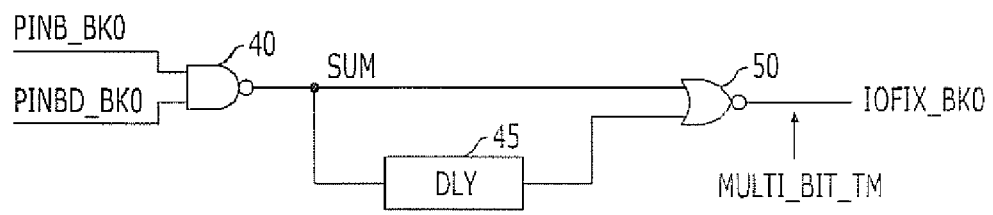
FIG. 7 is a configuration diagram illustrating a circuit generating a control signal IOFIX in accordance with an embodiment of the present invention.

FIG. 7 is a configuration diagram illustrating a circuit generating the control signal IOFIX in accordance with an embodiment of the present invention.

In the embodiment, the control signal IOFIX for the bank control may also use the signal PINB. That is, a NAND gate 40 performs a NAND operation on the signal PINB and a delay signal PINBD, which is generated by delaying the signal PINB signal by a certain time. An output signal of the NAND gate 40 is delayed by a delay circuit 45, and the output signal of the NAND gate 40 and an output signal of the delay circuit 45 are combined through a NOR gate 50. An output signal of the NOR gate 50 is combined with a multi-bit test mode signal MULTI_BIT_TM to generate the control signal IOFIX.

As described above, the signal PINB is a source signal inputted to each bank, and is a source of all signals including the YI enable signal and the signal IOSTB_TGO. The delay signal PINBD is a signal generated by delaying the signal PINB by a certain time in a delay unit such as the delay unit 20 illustrated FIG. 6.

Figure 8:
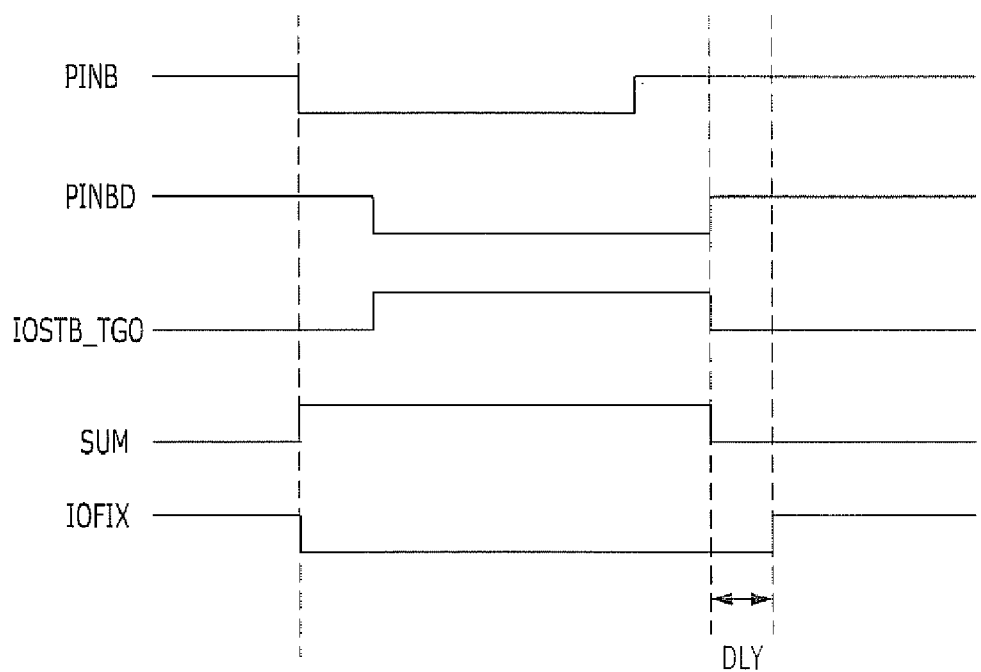
FIG. 8 is a timing diagram illustrating a multi-bit test operation in accordance with an embodiment of the present invention.

When the signal PINB and the delay signal PINBD are combined with each other, a pulse signal which starts in response to in information of the signal PINB and ends in response to information of the delay signal PINBD may be generated, as indicated by reference symbol "SUM" in FIG. 8.

Since the delay signal PINBD can have the substantially same timing as the signal IOSTB_TGO, the pulse signal SUM can have a pulse width to meet the duration tIOFIX of the conventional control signal IOFIX.

Furthermore, since the latter margin of the duration tIOFIX is to be secured in order to ensure its timing, the control signal IOFIX having an extended pulse width is generated by delaying the pulse signal SUM by a certain delay time in the delay circuit 45. The control signal IOFIX generated in the above-described manner is combined with the multi-bit test mode signal MULTI_BIT_TM to generate a final control signal IOFIX.

FIG. 7 is an exemplary diagram illustrating the generation of the control signal IOFIX to be used in the bank BK0. The control signals IOFIX are individually generated in order to control the respective banks. In particular, the procedure and configuration for generating the control signal IOFIX by using the single signal PINB are illustrated in accordance with exemplary embodiments of the present invention.

The exemplary embodiments of the present invention set forth above are merely for illustrative purposes. Since the control signal is generated by using one source signal, the control logics and the signal lines are simplified. Hence, the embodiments of the present invention can be applied to the implementation of the multi-bit test control circuit.

Upon the bank interleaving multi-bit test operation, a source signal of each bank is used to generate the control signal which controls the output of the bank enable signal and the data read from the bank, or controls the output of the set data value. Therefore, since singly source signal is used for the generation of the control signal, unnecessary source signal lines and control logics are reduced, to obtain efficient layout structures of products.

While the present invention has been described with respect to the specific embodiments, it will be apparent to those skilled in the art that various changes and modifications may be made without departing from the spirit and scope of the invention as defined in the following claims.

What is claimed is:

1. A multi-bit test control circuit comprising:
   an operation unit configured to combine a single source signal inputted to each bank with a delay signal generated by delaying the source signal by a certain time to generate a first pulse signal;
   a delay unit configured to delay the first pulse signal by a certain time; and
   a generation unit configured to combine an output signal of the operation unit with an output signal of the delay unit to generate a second pulse signal for a bank interleaving multi-bit test.

2. The multi-bit test control circuit of claim 1, wherein the generation unit is configured to generate the second pulse signal with respect to each bank.

3. The multi-bit test control circuit of claim 1, wherein the first pulse signal has a pulse that starts according to information of the source signal and ends according to information of the delay signal.

4. The multi-bit test control circuit of claim 1, wherein the delay unit is configured to ensure a timing margin of an end of the second pulse signal.

5. The multi-bit test control circuit of claim 1, wherein the second pulse signal is combined with a multi-bit test mode signal to generate a final bank interleaving multi-bit test control signal.

6. A multi-bit test control circuit comprising:
   a first generation unit configured to delay a single source signal inputted to each bank to generate a first control signal for a bank enable operation in a multi-bit test operation; and
   a second generation unit configured to combine the single source signal inputted to each bank with a delay signal generated by delaying the source signal to generate a second control signal for a bank interleaving multi-bit test operation.

7. The multi-bit test control circuit of claim 6, wherein the first generation unit is configured to generate the first control signals with respect to the banks, respectively.

8. The multi-bit test control circuit of claim 6, wherein the first generation unit is configured to generate the first control signal with respect to one or more banks.

9. The multi-bit test control circuit of claim 8, wherein the first generation unit is configured to generate the identical first control signal with respect to two banks.

10. The multi-bit test control circuit of claim 9, wherein the first generation unit comprises:
    a first delay section configured to delay a source signal inputted to a first bank;
    a second delay section configured to delay a source signal inputted to a second bank; and
    an operation section configured to combine an output signal of the first delay section with an output signal of the second delay section.

11. The multi-bit test control circuit of claim 6, wherein the second generation unit comprises:
- an operation section configured to combine the source signal inputted to each bank with the delay signal generated by delaying the source signal by a certain time to generate a first pulse signal;
- a delay section configured to delay the first pulse signal by a certain time; and
- a generation section configured to combine an output signal of the operation section with an output signal of the delay section to generate a second pulse signal for the bank interleaving multi-bit test operation.

12. The multi-bit test control circuit of claim 11, wherein the generation section is configured to generate the single second pulse signal for the bank interleave multi-bit test with respect to each bank.

13. The multi-bit test control circuit of claim 11, wherein the first pulse signal has a pulse that starts according to information of the source signal and ends according to information of the delay signal.

14. The multi-bit test control circuit of claim 11, wherein the delay unit is configured to ensure a timing margin of an end of the second pulse signal.

15. The multi-bit test control circuit of claim 11, wherein the second pulse signal is combined with a multi-bit test mode signal to generate a final control signal for the bank interleaving multi-bit test operation.

16. The multi-bit test control circuit of claim 6, further comprising:
- a data fixing unit configured to output data of the bank in response to the second control signal; and
- a driving unit configured to be enabled in response to the first control signal, and output an output of the data fixing unit to the outside.

17. The multi-bit test control circuit of claim 16, wherein the driving unit is provided in each bank.

18. The multi-bit test control circuit of claim 16, wherein the first generation unit is configured to generate the first control signals with respect to the banks, respectively.

19. The multi-bit test control circuit of claim 16, wherein the first generation unit is configured to generate the identical first control signal with respect to two banks.

20. The multi-bit test control circuit of claim 19, wherein the first generation unit comprises:
- a first delay section configured to delay a source signal inputted to a first bank;
- a second delay section configured to delay a source signal inputted to a second bank; and
- an operation section configured to combine an output signal of the first delay section with an output signal of the second delay section.

21. The multi-bit test control circuit of claim 16, wherein the second generating unit comprises:
- an operator configured to combine the source signal inputted to each bank and the delay signal generated by delaying the source signal by a certain time to generate a first pulse signal;
- a delay configured to delay the first pulse signal by a certain time; and
- a generator configured to combine an output signal of the operator with an output signal of the delay to generate a second pulse signal for the bank interleaving multi-bit test operation.

22. The multi-bit test control circuit of claim 21, wherein the first pulse signal has a pulse that starts according to information of the source signal and ends according to information of the delay signal.

23. The multi-bit test control circuit of claim 22, wherein the second pulse signal is combined with a multi-bit test mode signal to generate a final control signal for the bank interleaving multi-bit test operation.

* * * * *